(12) United States Patent
Roy et al.

(10) Patent No.: US 9,349,426 B1
(45) Date of Patent: May 24, 2016

(54) NON-VOLATILE RANDOM ACCESS MEMORY (NVRAM)

(71) Applicant: FREESCALE SEMICONDUCTOR, INC., Austin, TX (US)

(72) Inventors: Anirban Roy, Austin, TX (US); Thomas Jew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/741,674

(22) Filed: Jun. 17, 2015

(51) Int. Cl.
  *G11C 11/00* (2006.01)
  *G11C 11/16* (2006.01)

(52) U.S. Cl.
  CPC ............ *G11C 11/00* (2013.01); *G11C 11/1673* (2013.01); *G11C 11/1675* (2013.01)

(58) Field of Classification Search
  CPC . G11C 11/00; G11C 11/1673; G11C 11/1675
  See application file for complete search history.

(56) References Cited

U.S. PATENT DOCUMENTS

| 8,385,108 | B1 | 2/2013 | Abedifard et al. | |
| 2006/0039183 | A1* | 2/2006 | Lin | G11C 11/5607 365/158 |
| 2008/0239796 | A1* | 10/2008 | Aoki | B82Y 10/00 365/158 |
| 2011/0122674 | A1 | 5/2011 | Lin et al. | |

OTHER PUBLICATIONS

Chen et al, "A Nondestructive Self-Reference Scheme for Spin-Transfer Torque Random Access Memory (STT-RAM)", Automation & Test in Europe Conference & Exhibition Design(DATE), Mar. 8-12, 2010, pp. 148-153, Dresden.
Akoi et al, "A novel voltage sensing 1T/2MTJ cell with resistance ratio for highly stable and scalable MRAM", 2005 Symposium on VLSI Circuits. Digest of Technical Papers, Jun. 16-18, 2005, pp. 170-171.
Chung et al, "Fully integrated 54nm STT-RAM with the smallest bit cell dimension for high density memory application", 2010 IEEE International Electron Devices Meeting (IEDM), Dec. 6-8, 2010, pp. 12.7.1-12.7.4, San Francisco, CA.
Yu et al, "New Circuit Design Architecture for a 300-MHz 40nm 1Mb Embedded STT-MRAM with Great Immunity to PVT Variation", 2012 International Conference on Solid-State and Integrated Circuit (ICSIC), 2011, pp. 57-61, IPCSIT vol. 32, IACSIT Press, Singapore.
Tsuchida et al, "A 64Mb MRAM with clamped-reference and adequate-reference schemes", 2010 IEEE International Solid-State Circuits Conference Digest of Technical Papers (ISSCC), Feb. 7-11, 2010, pp. 258-259, San Francisco, CA.

* cited by examiner

*Primary Examiner* — Richard Elms
*Assistant Examiner* — Ajay Ojha

(57) ABSTRACT

A non-volatile memory device includes an array of non-volatile (NV) memory cells organized in pairs. Each pair is included with a transistor to form a memory unit. Each unit is coupled to a bit line, a word line, and a pair of source lines. The NV elements are programmable to either a relatively high resistance or relatively low resistance and the particularly resistance is established, by converting one resistance type to the other or maintaining the existing resistance type the direction of current through the NV element. A bit is formed from two NV cells in different memory units which are programmed to different resistance types and thereby provide a differential pair from which the logic state of the bit can be determined.

20 Claims, 3 Drawing Sheets

NON-VOLATILE RANDOM ACCESS MEMORY (NVRAM)

BACKGROUND

1. Field

This disclosure relates generally to integrated circuits, and more particularly, to non-volatile random access memories (NVRAMs).

2. Related Art

Non-volatile (NV) memories have become very important in a variety of applications but typically have characteristics that make them difficult to use as a random access memory. Some of the difficulties are very slow program and erase times, inability to erase one bit at a time, and high voltage requirements for program and erase. Some of the resistive NV memories, such as magnetic tunnel junction resistors (MTJs) overcome these difficulties making them a candidate for use as a random access memory (RAM). Other difficulties such as large space requirements make this less attractive.

Accordingly there is a need to provide further improvement in obtaining NVRAMs.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

Shown in FIG. 1 is a block diagram of an embodiment of a non-volatile random access memory (NVRAM) device.

Figure 1:
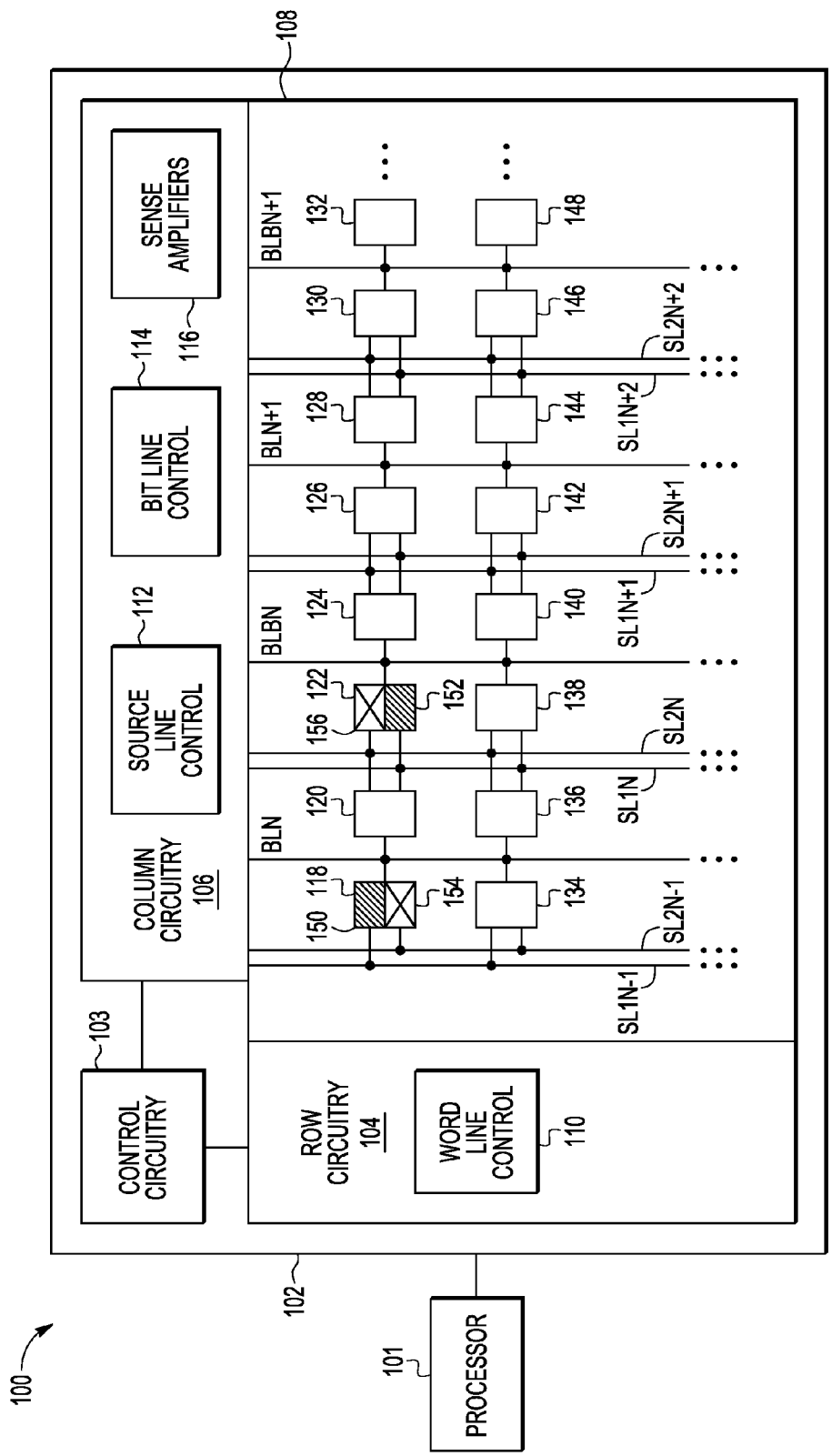
Figure 2:
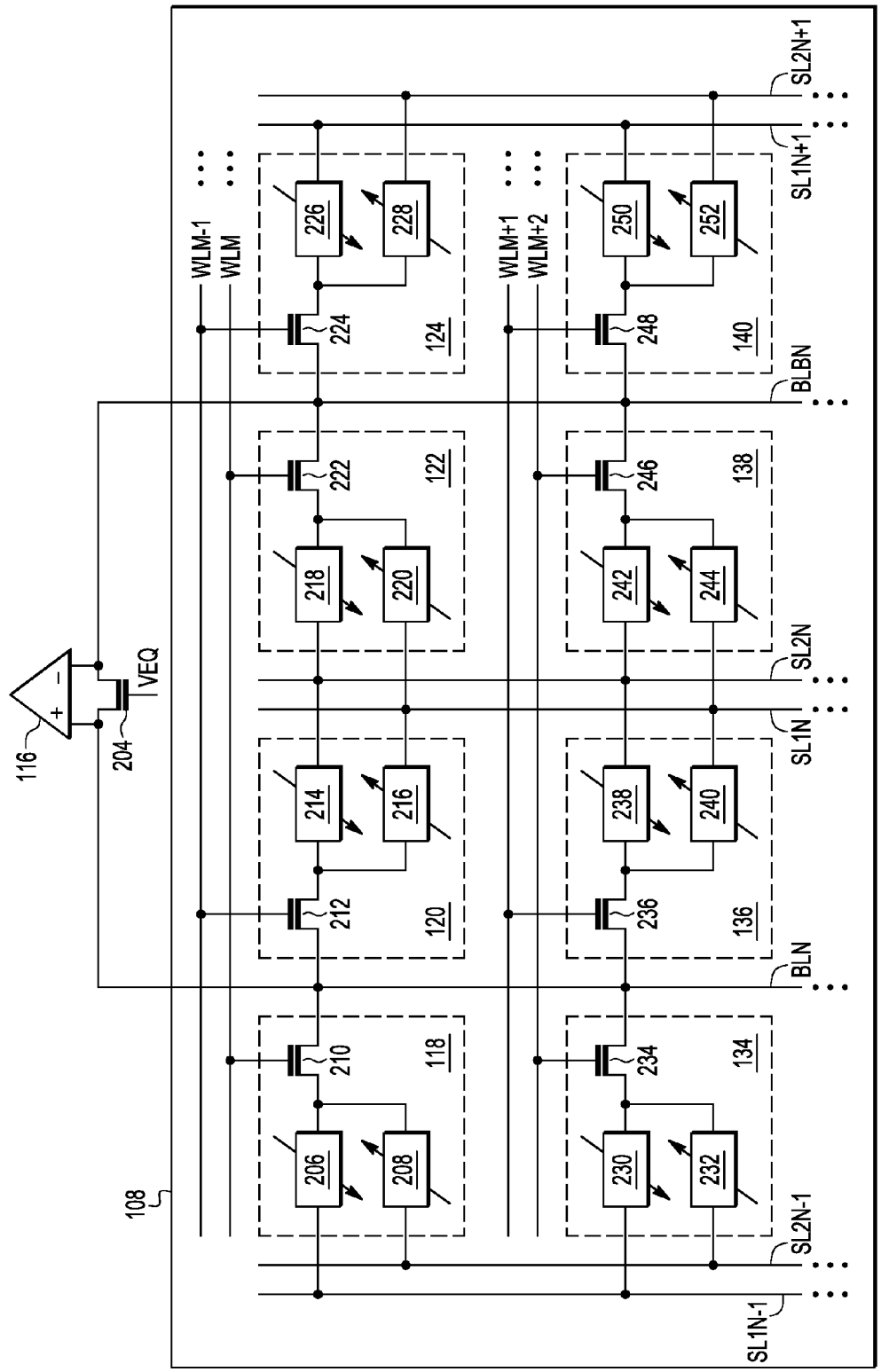

Shown in FIG. 2 is a circuit diagram of an embodiment of a portion of an array of the NVRAM of FIG. 1.

Figure 3:
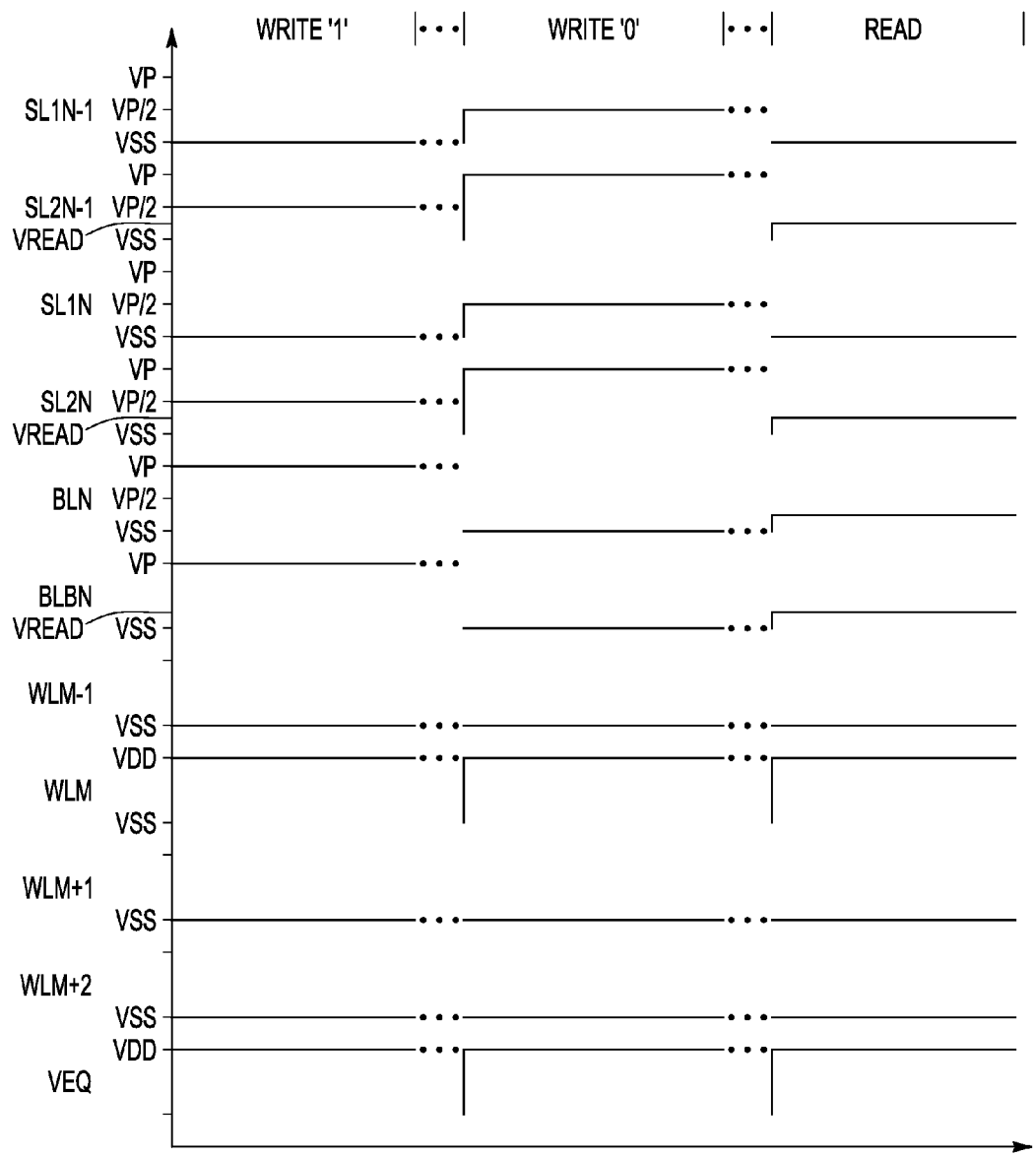

Shown in FIG. 3 is a timing diagram of various operating modes for one of the memory cells of the array shown in FIG. 2.

DETAILED DESCRIPTION

Embodiments of memory devices and methods for operating the memory device disclosed herein provide non-volatile storage using resistive elements that are read differentially to overcome problems reading memory cells in devices where low current changes and low voltages are used. Two resistive elements are paired across two bit lines to provide complementary data for differential sensing. The configuration allows the programming of paired bits without extra decoding. Since only one select transistor is used for each pair of resistive elements, the increased pitch of the cell will allow a larger select transistor width than an array where memory cells use two transistors and two resistive elements. This is better understood by reference to the drawings and the following written description.

FIG. 1 illustrates a block diagram of an embodiment of a processing system 100 that includes one or more processors 101, and memory device 102 with control circuitry 103, row circuitry 104 with word line control 110, column circuitry 106 with source line control 112, bit line control 114 and sense amplifiers 116, and memory array 108 with non-volatile (NV) memory cells 118-148.

Memory array 108 is coupled to column circuitry 106 and row circuitry 114. Row circuitry 114 and column circuitry 106 are coupled to control circuitry 103 and can receive addresses for read and write requests from computer processor(s) 101. Data to be written to memory array 104 is provided from a processor 101 to column circuitry 106. True bit lines BLN, BLN+1 and complementary bit lines BLBN, BLBN+1 are coupled between bit line control 114 and memory cells 118-148. Word lines (not shown) are coupled between word line control 110 and memory cells 118-148. Source line control 112 or other suitable component can provide analog voltage source line signals SL1N−1, SL1N, SL1N+1, SL1N+2, SL2N−1, SL2N, SL2N+1, SL2N+2 to NV memory cells 118-148.

Control circuitry 103 controls program and erase procedures of the memory array 108 through row circuitry 104 and column circuitry 106, such as in response to requests from one or more processors 101. Data is read from the memory array 108 via column circuitry 106 by sensing voltage levels on bit lines BLN, BLN+1, BLBN, BLBN+1, which are coupled between memory array 108 and sense amplifiers 116. Sense amplifiers 116 provide data from respective columns of data in memory array 108 to one or more processors 101.

Row circuitry 104 provides a row address that is used to select one row of memory array 108 for read or write operations. A power supply voltage VDD is also conducted on word lines. VDD can be any suitable voltage. Column circuitry 106 receives a column address and includes a plurality of input/output (I/O) terminals for receiving or providing data signals. Bit lines run in the column direction, and the word lines run in the row direction.

Memory cells 118-148 each include two programmable resistive elements and a select transistor. Notably, each bit of data is stored using one resistive element in one of the memory cells and another resistive element in an adjacent one of the memory cells, as indicated by shaded portion 150 of memory cell 118 and shaded portion 152 of memory cell 122. The other resistive element in each memory cell can be used along with another resistive element of another corresponding memory cell to store another bit of data, as indicated by crossed portion 154 of memory cell 118 and crossed portion 156 of memory cell 122. Likewise, other pairs of memory cells 120/124, 126/130, 128/132, 134/138, 136/140, 142/146, and 144/148 can be used together to store two bits of data in each pair.

Although memory array 108 is shown with sixteen memory cells 118-148, two word lines (e.g., WLM−1, WLM, WLM+1, WLM+2 in FIG. 2), one true bit line (BLN), and one complementary bit line (BLBN), memory device 104 can include any suitable number of memory cells, word lines, and true and complementary bit lines. Processing system 100 can be implemented using CMOS (complementary metal-oxide semiconductor) transistors as a System On Chip (SOC) or other integrated circuit device which includes at least one processor 101 coupled to memory device 104 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternate embodiment, memory device 104 is implemented alone in an integrated circuit without any other devices. In another alternative embodiment, memory device 104 is part of a larger system on the integrated circuit. Additionally, NV memory cells 118-148 can all be implemented with similar components, such as shown for example in FIG. 2.

Shown in FIG. 2 is an embodiment of a portion of array 108 having word lines WLM−1, WLM, WLM+1, WLM+2; bit line BLN; complementary bit line BLBN; source lines SL1N−1, SL1N, SL1N+1, SL1N+2, SL2N−1, SL2N, SL2N+1, SL2N+2; and NV memory cells 118-124 and 134-140. Bit line BLN and complementary bit line BLBN are connected to respective current electrodes of equalizing transistor 204. A gate electrode of equalizing transistor 204 is coupled to equalizing control signal VEQ. A non-negating input to differential sense amplifier 116 is coupled to bit line BLN at a first current electrode of equalizing transistor 204 and a negating input to differential sense amplifier 116 is coupled to bit line BLBN at a second current electrode of equalizing transistor 204.

Memory cell 118 includes resistive element 206 having a first terminal coupled to source line SL1N−1 and a second terminal coupled to a first current electrode of select transistor 210, and resistive element 208 having a first terminal coupled to source line SL2N−1 and a second terminal coupled to the first current electrode of select transistor 210. A control electrode of select transistor 210 is coupled to word line WLM and a second current electrode of select transistor 210 is coupled to bit line BLN.

Memory cell 120 includes resistive element 214 having a first terminal coupled to source line SL1N and a second terminal coupled to a first current electrode of select transistor 212, and resistive element 216 having a first terminal coupled to source line SL2N and a second terminal coupled to the first current electrode of select transistor 212. A control electrode of select transistor 212 is coupled to word line WLM−1 and a second current electrode of select transistor 212 is coupled to bit line BLN.

Memory cell 122 includes resistive element 218 having a first terminal coupled to source line SL2N and a second terminal coupled to a first current electrode of select transistor 222, and resistive element 220 having a first terminal coupled to source line SL1N and a second terminal coupled to the first current electrode of select transistor 222. A control electrode of select transistor 222 is coupled to word line WLM and a second current electrode of select transistor 222 is coupled to complementary bit line BLBN.

Memory cell 124 includes resistive element 226 having a first terminal coupled to source line SL1N+1 and a second terminal coupled to a first current electrode of select transistor 224, and resistive element 228 having a first terminal coupled to source line SL2N+1 and a second terminal coupled to the first current electrode of select transistor 224. A control electrode of select transistor 224 is coupled to word line WLM−1 and a second current electrode of select transistor 224 is coupled to complementary bit line BLBN.

Memory cell 134 includes resistive element 230 having a first terminal coupled to source line SL1N−1 and a second terminal coupled to a first current electrode of select transistor 234, and resistive element 232 having a first terminal coupled to source line SL2N−1 and a second terminal coupled to the first current electrode of select transistor 234. A control electrode of select transistor 234 is coupled to word line WLM+2 and a second current electrode of select transistor 234 is coupled to bit line BLN.

Memory cell 136 includes resistive element 238 having a first terminal coupled to source line SL2N and a second terminal coupled to a first current electrode of select transistor 236, and resistive element 240 having a first terminal coupled to source line SL1N and a second terminal coupled to the first current electrode of select transistor 236. A control electrode of select transistor 236 is coupled to word line WLM+1 and a second current electrode of select transistor 236 is coupled to bit line BLN.

Memory cell 138 includes resistive element 242 having a first terminal coupled to source line SL2N and a second terminal coupled to a first current electrode of select transistor 246, and resistive element 244 having a first terminal coupled to source line SL1N and a second terminal coupled to the first current electrode of select transistor 246. A control electrode of select transistor 246 is coupled to word line WLM+2 and a second current electrode of select transistor 246 is coupled to complementary bit line BLBN.

Memory cell 140 includes resistive element 250 having a first terminal coupled to source line SL1N+1 and a second terminal coupled to a first current electrode of select transistor 248, and resistive element 252 having a first terminal coupled to source line SL2N+1 and a second terminal coupled to the first current electrode of select transistor 248. A control electrode of select transistor 248 is coupled to word line WLM+1 and a second current electrode of select transistor 248 is coupled to complementary bit line BLBN.

Resistive elements 206, 208, 214, 216, 218, 220, 226, 228, 230, 232, 238, 240, 242, 244, 250, 252 may be implemented using programmable magnetic tunneling junction resistors that change from a high resistance state to a low resistance state and vice versa, depending on the current passed through the resistor during the programming stage, as further described in connection with FIG. 3. Resistive elements 206, 208, 214, 216, 218, 220, 226, 228, 230, 232, 238, 240, 242, 244, 250, 252 remain in their programmed state until sufficient current is applied in an opposite direction to change the state.

Resistive elements 206, 208, 214, 216, 218, 220, 226, 228, 230, 232, 238, 240, 242, 244, 250, 252 (also referred to herein as non-volatile (NV) elements) are shown in FIG. 2 with an arrow indicating the direction of current required to place the element in a high resistance state. In particular, resistive elements 206, 216, 218, 228, 230, 240, 242, 252 change to or remain in a high resistance state when current flows from a corresponding select transistor 210-248 to a respective source line SL1N−1, SL1N, SL2N, SL1N+1, SL2N+2. Resistive elements 208, 214, 220, 226, 232, 238, 244, 250 change to or remain in a high resistance state when current flows from a respective source line SL1N−1, SL2N−1, SL1N, SL2N, SL1N+1, SL2N+2 to a corresponding select transistor 210-248. If current flows in a direction opposite to the direction of the arrow, the state will change to or remain in a low resistance state.

Each bit of data is stored using one resistive element in one of the memory cells coupled to a first of the word lines and one of the true bit lines, and a second resistive element in another one of the memory cells coupled to the same word line as the other memory cell and a complementary bit line corresponding to the true bit line. For example, resistive element 206 in memory cell 118 and resistive element 220 in memory cell 122 are used to store one bit of data, while resistive element 208 in memory cell 118 and resistive element 218 in memory cell 122 are used to store another bit of data. The combination of resistive elements 206/220 and resistive elements 208/218 are also referred to herein at non-volatile memory units.

Shown in FIG. 3 is a timing diagram of signals for memory cell 118/122 of array 108 shown in FIG. 2 during write "1", write "0", and read modes of operation. To write and store "1" using resistive elements 206 and 220, SL1N−1 is low at VSS (or ground),
SL2N−1 is at voltage level VP/2, where VP is a programming or reference voltage,
SL1N is low at VSS (or ground),
SL2N is at VP/2,
bit lines BLN and BLBN are high at voltage VP,
word line WLM−1 is at VSS (or ground),
word line WLM is high at voltage VDD, where VDD is a supply voltage,
word lines WLM+1 and WLM+2 are low at VSS (or ground), and equalizer transistor 204 is in conducting mode with voltage VEQ being high.

With the signals set as provided above, select transistors 210 and 222 are in conductive mode, and current flows from bit line BLN to source line SL1N−1 through select transistor 210 and resistive element 206 to place resistive element 206 in high resistance state. At the same time, current flows from bit line BLBN to source line SL1N through select transistor 222 and resistive element 220 to place resistive element 220 in low resistance state.

Although not shown in FIG. 3, to write and store "0" using resistive elements 206 and 220,
SL1N−1 is high at VP,
SL2N−1 is at voltage level VP/2,
SL1N is high at VP,
SL2N is at VP/2,
bit lines BLN and BLBN are at voltage VSS (or ground),
word line WLM−1 is at VSS (or ground),
word line WLM is high at voltage VDD,
word lines WLM+1 and WLM+2 are low at VSS (or ground), and
equalizer transistor 204 is in conducting mode with voltage VEQ being high.

With the signals set as provided above, select transistors 210 and 222 are in conductive mode, and current flows from source line SL1N−1 to bit line BLN to through resistive element 206 and select transistor 210 to place resistive element 206 in low resistance state. At the same time, current flows from source line SL1N to bit line BLBN through resistive element 220 and select transistor 222 to place resistive element 220 in high resistance state.

To write and store "0" using resistive elements 208 and 218,
SL1N−1 is voltage level VP/2,
SL2N−1 is at voltage level VP,
SL1N is low at VP/2,
SL2N is at VP,
bit lines BLN and BLBN are low at voltage VSS (or ground),
word line WLM−1 is at VSS (or ground),
word line WLM is high at voltage VDD,
word lines WLM+1 and WLM+2 are low at VSS (or ground), and
equalizer transistor 204 is in conducting mode with voltage VEQ being high.

With the signals set as provided above, select transistors 210 and 222 are in conductive mode, and current flows from source line SL2N−1 to bit line BLN through resistive element 208 and select transistor 210 to place resistive element 208 in high resistance state. At the same time, current flows from source line SL2N to bit line BLBN through resistive element 218 and select transistor 222 to place resistive element 218 in low resistance state.

Although not shown in FIG. 3, to write and store "1" using resistive elements 208 and 218,
SL1N−1 is voltage level VP/2, where VP is a programming voltage,
SL2N−1 is at voltage level VSS
SL1N is at VP/2,
SL2N is at VSS,
bit lines BLN and BLBN are high at voltage VP,
word line WLM−1 is at VSS (or ground),
word line WLM is high at voltage VDD,
word lines WLM+1 and WLM+2 are low at VSS (or ground), and
equalizer transistor 204 is in conducting mode with voltage VEQ being high.

With the signals set as provided above, select transistors 210 and 222 are in conductive mode, and current flows from bit line BLN to source line SL2N−1 to through select transistor 210 and resistive element 208 to place resistive element 208 in low resistance state. At the same time, current flows from bit line BLBN to source line SL2N through select transistor 222 and resistive element 218 and to place resistive element 218 in high resistance state.

Note that during both write "1" and write "0" modes, resistive elements in both cells are programmed at the same time, eliminating additional decoding that would be required to address the resistive elements individually.

Differential sensing of bit line BLN and complementary bit line BLBN is performed during read operations using bit lines BLN and BLBN coupled to sense amplifier 116. To read data stored in the combination of resistive elements 206 and 220,
SL1N−1 is voltage level VSS,
SL2N−1 is at a read voltage level VREAD, such as 150 mV,
SL1N is at VSS,
SL2N is at VREAD,
bit lines BLN and BLBN are at read voltage VREAD,
word line WLM−1 is at VSS (or ground),
word line WLM is high at voltage VDD,
word lines WLM+1 and WLM+2 are low at VSS (or ground), and
equalizer transistor 204 is in conducting mode with voltage VEQ being high.

With the signals set as provided above, select transistors 210 and 222 are in conductive mode, and voltage on bit lines BLN and BLBN is sensed differentially to determine whether the combination of resistive elements 206 and 220 store a "1" or a "0". If resistive element 206 is in a low resistance state and resistive element 220 is in a high resistance state, bit line BLN will be pulled low faster than bit line BLBN due to the difference in the resistance of the resistive elements 206 and 220 (if the sense amplifier is sensing voltage) and if sense amplifier 116 is current sensing then the current on BLB is higher than BLBN, thereby causing sense amplifier 116 to read a "0". If resistive element 206 is in a high resistance state and resistive element 220 is in a low resistance state, bit line BLN will either discharge faster or have higher current relative to bit line BLBN, thereby causing sense amplifier 116 to read a "1".

To read data stored in the combination of resistive elements 208 and 218,
SL1N−1 is at read voltage level VREAD,
SL2N−1 is at VSS,
SL1N is at VREAD,
SL2N is at VSS,
bit lines BLN and BLBN are at read voltage VREAD,
word line WLM−1 is at VSS (or ground),
word line WLM is high at voltage VDD,
word lines WLM+1 and WLM+2 are low at VSS (or ground), and
equalizer transistor 204 is in conducting mode with voltage VEQ being high.

With the signals set as provided above, select transistors 210 and 222 are in conductive mode, and voltage on bit lines BLN and BLBN is sensed differentially to determine whether the combination of resistive elements 208 and 218 store a "1" or a "0". If resistive element 208 is in a low resistance state and resistive element 218 is in a high resistance state, bit line BLN will either discharge slower or have lower current than bit line BLBN, thereby causing sense amplifier to read a "1". If resistive element 208 is in a high resistance state and resistive element 218 is in a low resistance state, bit line BLN will discharge faster or have more current than bit line BLBN, thereby causing sense amplifier to read a "0".

By now it should be appreciated that in some embodiments, there has been provided a non-volatile (NV) memory device (108) that includes a true bit line (BLN) and a complementary bit line (BLBN), a first word line (WLM), and a plurality of NV memory elements comprising a first NV memory element (206), a second NV memory element (208), a third NV memory element (218), and a fourth NV memory element (220). Each of the first, second, third, and fourth NV memory elements can have a first terminal and second terminal, wherein a higher resistance state is established by providing a write current from the first terminal to the second terminal and a lower resistance state is established by providing a write current from the second terminal to the first terminal. A first transistor (210) can have a first current electrode coupled to the true bit line (BLN), a control electrode coupled to the first word line, and a second current electrode coupled to the first terminal of the first NV memory element and the second terminal of the second NV memory element. A first source line (SL1N−1) can be coupled to the second terminal of the first NV memory element. A second source line (SL2N−1) can be coupled to the first terminal of the second NV memory element. A second transistor (222) can have a first current electrode coupled to the complementary bit line (BLBN), a control electrode coupled to the first word line, and a second current electrode coupled to the first terminal of the third NV memory element and the second terminal of the fourth NV memory element. A third source line (SL2N) can be coupled to the second terminal of the third NV memory element. A fourth source line (SL1N) can be coupled to the first terminal of the fourth NV memory element.

In another aspect, the first transistor, the second transistor and the first, second, third, and fourth NV memory elements (118 and 122) can comprise a two bit NV memory unit.

In another aspect, the first and fourth NV memory elements can comprise a first bit of the two bit memory unit and the second and third NV memory elements can comprise a second bit of the two bit memory unit.

In another aspect, during a read of the first bit of the two bit memory unit, the first word line can be for causing the first and second transistors to couple the first terminal of the first NV memory element to the true bit line and the second terminal of the fourth NV memory element to the complementary bit line and the first and fourth source lines are for providing a current sink.

In another aspect, during a write of a logic high to the first bit, the first word line can be for causing the first and second transistors to simultaneously couple the first terminal of the first NV memory element to the true bit line and the second terminal of the fourth NV memory element to the complementary bit line, the first source line can be for receiving a low potential, the true bit line can be for receiving a write voltage, the complementary bit line can be for receiving the low potential, and the fourth source line can be for receiving the write voltage.

In another aspect, during the write of a logic high to the first bit, the second source line and the third source line can be for receiving a reference voltage.

In another aspect, the reference voltage can be between the low potential and the logic high.

In another aspect, the reference voltage can be halfway between the low potential and the logic high.

In another aspect, the memory device can further comprise a second word line (WLM). The plurality of NV memory elements can further comprise a fifth NV memory element (214), a sixth NV memory element (216), a seventh NV memory element (226), and an eighth NV memory element (228), wherein each of the fifth, sixth, seventh, and eighth NV memory elements can be characterized as having a first terminal and second terminal. The higher resistance state can be established by providing the write current from the first terminal to the second terminal and the lower resistance state can be established by providing the write current from the second terminal to the first terminal. A third transistor (212) can have a first current electrode coupled to the true bit line (BLN), a control electrode coupled to the second word line, and a second current electrode coupled to the second terminal of the fifth NV memory element (214) and the first terminal of the sixth NV memory element (216). The third source line can be coupled to the first terminal of the fifth NV memory element, and the fourth source line can be coupled to the second terminal of the sixth NV memory element. A fourth transistor (224) can have a first current electrode coupled to the complementary bit line, a control electrode coupled to the second word line, and a second current electrode coupled to the second terminal of the seventh NV memory element (226) and the first terminal of the eighth NV memory element (228). A fifth source line (SL2N+1) can be coupled to the first terminal of the seventh NV memory element; and a sixth source line (SL1N+1) can be coupled to the second terminal of the eighth NV memory element.

In another aspect, the memory device can further comprise a second word line (WLM+2). The plurality of NV memory elements can further comprise a fifth NV memory element (230), a sixth NV memory element (232), a seventh NV memory element (242), and an eighth NV memory element (244). Each of the fifth, sixth, seventh, and eighth NV memory elements are characterized as having a first terminal and second terminal. The higher resistance state can be established by providing the write current from the first terminal to the second terminal and the lower resistance state can be established by providing the write current from the second terminal to the first terminal. A third transistor (234) can have a first current electrode coupled to the true bit line (BLN), a control electrode coupled to the second word line, and a second current electrode coupled to the first terminal of the fifth NV memory element (214) and the second terminal of the sixth NV memory element (216). The first source line can be coupled to the second terminal of the fifth NV memory element, and the second source line can be coupled to the first terminal of the sixth NV memory element. A fourth transistor (246) can have a first current electrode coupled to the complementary bit line, a control electrode coupled to the second word line, and a second current electrode coupled to the first terminal of the seventh NV memory element (226) and the second terminal of the eighth NV memory element (228). The third source line can be coupled to the first terminal of the seventh NV memory element and the fourth source line can be coupled to the second terminal of the first terminal of the eighth NV memory element.

In other embodiments, a method of operating a memory device (108) in which the memory device can comprise a first bit having a first portion (206) in a first memory unit (118) and a second portion (220) in a second memory unit (122) and a second bit having a first portion (208) in the first memory unit and a second portion (218) in the second memory unit, the first portions are complementary to the second portions, wherein the first unit is coupled to a word line (WLM), a true bit line (BLN), a first source line (SL1N−1), and a second source line (SL2N−1), the second unit is coupled to the word line, a complementary bit line (BLBN), a third source line (SL2N) and a fourth source line (SL1N), the first and second portions comprise non-volatile (NV) memory units (206,208, 218, 220) which are written to a relatively high resistance with a write current passing from a first terminal to a second terminal and to a relatively low resistance with a write current passing from the second terminal to the first terminal. The method can include writing a first state into the first bit by writing a relatively high resistance into the first portion of the first unit using the true bit line and a relatively low resistance into the first portion of the second unit using the complementary bit line, and sensing a logic state of the first bit by coupling the first portion of the first unit to the true bit line and the first portion of the second unit to the complementary bit line by enabling the word line and using differential sensing on the true bit line and the complementary bit line.

In another aspect, the differential sensing comprises sensing a voltage differential between the true bit line and the complementary bit line.

In another aspect, the differential sensing comprises sensing a current differential between the true bit line and the complementary bit line.

In another aspect, the writing a relatively high resistance into the first portion of the first unit using the true bit line and a relatively low resistance into the first portion of the second unit is performed simultaneously.

In another aspect, the method can further comprise sensing a logic state of the second bit by coupling the second portion of the first unit to the true bit line and the second portion of the second unit to the complementary bit line by enabling the word line and using differential sensing on the true bit line and the complementary bit line.

In another aspect, the method can further comprise enabling the first and fourth source lines during the writing the first logic state into the first portions of the first and second units.

In another aspect, the enabling the first and fourth source lines comprises coupling the first and fourth source lines to ground.

In another aspect, the method can further comprise writing a second state into the first bit by writing a relatively high resistance into the second portion of the first unit using the true bit line and the second source line and a relatively low resistance into the second portion of the second unit using the complementary bit line and the third source line.

In another aspect, the writing the second state comprises flowing current from the second source to the true bit line through the second portion of the first unit and from the third source line to the complementary bit line through the second portion of the second unit.

In further embodiments, a memory array (108) can comprise a first bit line (BLN) and a second bit line (BLBN), a first word line (WLM) and a second word line (WLM−1), a first source line (SL1N−1), a second source line (SL2N−1), a third source line (SL2N), and a fourth source line (SL1N), and a plurality of non-volatile (NV) memory elements (206, 208, 218, 220, 214, 216) each characterized as having a first terminal and second terminal. A higher resistance state can be established by providing a write current from the first terminal to the second terminal and a lower resistance state is established by providing a write current from the second terminal to the first terminal. A first NV unit (118) can comprise a first NV memory element (206) and a second NV memory element (208) of the plurality of NV memory elements. A first transistor (210) can have a control electrode coupled to the first word line, a first current electrode coupled to the first bit line, and a second current electrode coupled to the first terminal of the first NV memory element and the second terminal of the second NV memory element. The first source line can be coupled to the second terminal of the first NV memory element and the second source line can be coupled to the first terminal of the second NV memory element. A second NV unit (122) can comprise a third NV memory element (218) and a fourth NV memory element (220) of the plurality of NV memory elements, and a second transistor (224) having a control electrode coupled to the first word line, a first current electrode coupled to the second bit line, and a second current electrode coupled to the first terminal of the third NV memory element and the second terminal of the fourth NV memory element. The third source line can be coupled to the second terminal of the third NV memory element and the fourth source line can be coupled to the first terminal of the fourth NV memory element. A third NV unit (120) can comprise a fifth NV memory element (214) and a sixth NV memory element (216) of the plurality of NV memory elements, and a third transistor (212) having a control electrode coupled to the second word line, a first current electrode coupled to the first bit line, and a second current electrode coupled to the second terminal of the fifth NV memory element and the first terminal of the fourth NV memory element. The third source line can be coupled to the first terminal of the fifth NV memory element and the fourth source line can be coupled to the second terminal of the sixth NV memory element.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A non-volatile (NV) memory device comprising:
a true bit line and a complementary bit line;
a first word line;
a plurality of NV memory elements comprising a first NV memory element, a second NV memory element, a third NV memory element, and a fourth NV memory element, wherein each of the first, second, third, and fourth NV memory elements are characterized as having a first terminal and second terminal, wherein a higher resistance state is established by providing a write current from the first terminal to the second terminal and a lower resistance state is established by providing a write current from the second terminal to the first terminal;
a first transistor having a first current electrode coupled to the true bit line, a control electrode coupled to the first word line, and a second current electrode coupled to the first terminal of the first NV memory element and the second terminal of the second NV memory element;
a first source line coupled to the second terminal of the first NV memory element;
a second source line coupled to the first terminal of the second NV memory element;
a second transistor having a first current electrode coupled to the complementary bit line, a control electrode coupled to the first word line, and a second current electrode coupled to the first terminal of the third NV memory element and the second terminal of the fourth NV memory element;
a third source line coupled to the second terminal of the third NV memory element; and
a fourth source line coupled to the first terminal of the fourth NV memory element.

2. The memory device of claim 1, wherein the first transistor, the second transistor and the first, second, third, and fourth NV memory elements comprise a two bit NV memory unit.

3. The memory device of claim 1, wherein:
the first and fourth NV memory elements comprise a first bit of the two bit memory unit and the second and third NV memory elements comprise a second bit of the two bit memory unit.

4. The memory device of claim 1, wherein:
during a read of the first bit of the two bit memory unit, the first word line is for causing the first and second transistors to couple the first terminal of the first NV memory element to the true bit line and the second terminal of the fourth NV memory element to the complementary bit line and the first and fourth source lines are for providing a current sink.

5. The memory device of claim 1, wherein:
during a write of a logic high to the first bit, the first word line is for causing the first and second transistors to simultaneously couple the first terminal of the first NV memory element to the true bit line and the second terminal of the fourth NV memory element to the complementary bit line, the first source line is for receiving a low potential, the true bit line is for receiving a write voltage, the complementary bit line is for receiving the low potential, and the fourth source line is for receiving the write voltage.

6. The memory device of claim 5, wherein during the write of a logic high to the first bit, the second source line and the third source line are for receiving a reference voltage.

7. The memory device of claim 6, wherein the reference voltage is between the low potential and the logic high.

8. The memory device of claim 7, wherein the reference voltage is halfway between the low potential and the logic high.

9. The memory device of claim 1, further comprising:
a second word line;
wherein the plurality of NV memory elements further comprises a fifth NV memory element, a sixth NV memory element, a seventh NV memory element, and an eighth NV memory element, wherein each of the fifth, sixth, seventh, and eighth NV memory elements are characterized as having a first terminal and second terminal, wherein the higher resistance state is established by providing the write current from the first terminal to the second terminal and the lower resistance state is established by providing the write current from the second terminal to the first terminal;
a third transistor having a first current electrode coupled to the true bit line, a control electrode coupled to the second word line, and a second current electrode coupled to the second terminal of the fifth NV memory element and the first terminal of the sixth NV memory element, wherein the third source line is coupled to the first terminal of the fifth NV memory element, and the fourth source line is coupled to the second terminal of the sixth NV memory element;
a fourth transistor having a first current electrode coupled to the complementary bit line, a control electrode coupled to the second word line, and a second current electrode coupled to the second terminal of the seventh NV memory element and the first terminal of the eighth NV memory element;
a fifth source line coupled to the first terminal of the seventh NV memory element; and
a sixth source line coupled to the second terminal of the eighth NV memory element.

10. The memory device of claim 1, further comprising:
a second word line;
wherein the plurality of NV memory elements further comprises a fifth NV memory element, a sixth NV memory element, a seventh NV memory element, and an eighth NV memory element, wherein each of the fifth, sixth, seventh, and eighth NV memory elements are characterized as having a first terminal and second terminal, wherein the higher resistance state is established by providing the write current from the first terminal to the second terminal and the lower resistance state is established by providing the write current from the second terminal to the first terminal;
a third transistor having a first current electrode coupled to the true bit line, a control electrode coupled to the second word line, and a second current electrode coupled to the first terminal of the fifth NV memory element and the second terminal of the sixth NV memory element, wherein the first source line is coupled to the second terminal of the fifth NV memory element, and the second source line is coupled to the first terminal of the sixth NV memory element; and
a fourth transistor having a first current electrode coupled to the complementary bit line, a control electrode coupled to the second word line, and a second current electrode coupled to the first terminal of the seventh NV memory element and the second terminal of the eighth NV memory element, wherein the third source line is coupled to the first terminal of the seventh NV memory element and the fourth source line is coupled to the second terminal of the first terminal of the eighth NV memory element.

11. A method of operating a memory device in which the memory device comprises a first bit having a first portion in a first memory unit and a second portion in a second memory unit and a second bit having a first portion in the first memory unit and a second portion in the second memory unit, the first portions are complementary to the second portions, wherein the first unit is coupled to a word line, a true bit line, a first source line, and a second source line, the second unit is coupled to the word line, a complementary bit line, a third source line and a fourth source line, the first and second portions comprise non-volatile (NV) memory units which are written to a relatively high resistance with a write current passing from a first terminal to a second terminal and to a relatively low resistance with a write current passing from the second terminal to the first terminal, the method comprising:

writing a first state into the first bit by writing a relatively high resistance into the first portion of the first unit using the true bit line and a relatively low resistance into the first portion of the second unit using the complementary bit line; and sensing a logic state of the first bit by coupling the first portion of the first unit to the true bit line and the first portion of the second unit to the complementary bit line by enabling the word line and using differential sensing on the true bit line and the complementary bit line.

12. The method of claim 11, wherein the differential sensing comprises sensing a voltage differential between the true bit line and the complementary bit line.

13. The method of claim 11, wherein the differential sensing comprises sensing a current differential between the true bit line and the complementary bit line.

14. The method of claim 11, wherein the writing a relatively high resistance into the first portion of the first unit using the true bit line and a relatively low resistance into the first portion of the second unit is performed simultaneously.

15. The method of claim 11, further comprising sensing a logic state of the second bit by coupling the second portion of the first unit to the true bit line and the second portion of the second unit to the complementary bit line by enabling the word line and using differential sensing on the true bit line and the complementary bit line.

16. The method of claim 15, further comprising enabling the first and fourth source lines during the writing the first logic state into the first portions of the first and second units.

17. The method of claim 16, wherein the enabling the first and fourth source lines comprises coupling the first and fourth source lines to ground.

18. The method of claim 11, further comprising:
writing a second state into the first bit by writing a relatively high resistance into the second portion of the first unit using the true bit line and the second source line and a relatively low resistance into the second portion of the second unit using the complementary bit line and the third source line.

19. The method of claim 18, wherein the writing the second state comprises flowing current from the second source to the true bit line through the second portion of the first unit and from the third source line to the complementary bit line through the second portion of the second unit.

20. A memory array, comprising:
a first bit line and a second bit line;
a first word line and a second word line;
a first source line, a second source line, a third source line, and a fourth source line;
a plurality of non-volatile (NV) memory elements each characterized as having a first terminal and second terminal, wherein a higher resistance state is established by providing a write current from the first terminal to the second terminal and a lower resistance state is established by providing a write current from the second terminal to the first terminal;
a first NV unit, comprising:
a first NV memory element and a second NV memory element of the plurality of NV memory elements; and
a first transistor having a control electrode coupled to the first word line, a first current electrode coupled to the first bit line, and a second current electrode coupled to the first terminal of the first NV memory element and the second terminal of the second NV memory element, wherein the first source line is coupled to the second terminal of the first NV memory element and the second source line is coupled to the first terminal of the second NV memory element;
a second NV unit, comprising:
a third NV memory element and a fourth NV memory element of the plurality of NV memory elements; and
a second transistor having a control electrode coupled to the first word line, a first current electrode coupled to the second bit line, and a second current electrode coupled to the first terminal of the third NV memory element and the second terminal of the fourth NV memory element, wherein the third source line is coupled to the second terminal of the third NV memory element and the fourth source line is coupled to the first terminal of the fourth NV memory element; and
a third NV unit, comprising:
a fifth NV memory element and a sixth NV memory element of the plurality of NV memory elements; and
a third transistor having a control electrode coupled to the second word line, a first current electrode coupled to the first bit line, and a second current electrode coupled to the second terminal of the fifth NV memory element and the first terminal of the fourth NV memory element, wherein the third source line is coupled to the first terminal of the fifth NV memory element and the fourth source line is coupled to the second terminal of the sixth NV memory element.

\* \* \* \* \*